(12) United States Patent
Kim et al.

(10) Patent No.: US 7,361,606 B2
(45) Date of Patent: Apr. 22, 2008

(54) METHOD OF FORMING A METAL LINE AND METHOD OF MANUFACTURING DISPLAY SUBSTRATE HAVING THE SAME

(75) Inventors: Sang Gab Kim, Seoul (KR); Shi Yul Kim, Yongin-si (KR); Min Seok Oh, Yongin-si (KR); Hong Kee Chin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/564,308

(22) Filed: Nov. 29, 2006

(65) Prior Publication Data

US 2007/0158306 A1    Jul. 12, 2007

(30) Foreign Application Priority Data

Jan. 12, 2006    (KR) ...................... 10-2006-0003656

(51) Int. Cl.
*H01L 21/302* (2006.01)

(52) U.S. Cl. ...................... 438/708; 438/709; 438/717; 438/720; 438/722; 438/742

(58) Field of Classification Search ................ 438/708, 438/709, 717, 720, 722, 742
See application file for complete search history.

(56) References Cited

U.S. PATENT DOCUMENTS

| | | | | |
|---|---|---|---|---|
| 5,976,986 A | * | 11/1999 | Naeem et al. | ............... 438/714 |
| 6,526,996 B1 | * | 3/2003 | Chang et al. | ................ 134/1.3 |
| 2002/0132385 A1 | * | 9/2002 | Dojo et al. | ................... 438/30 |

* cited by examiner

*Primary Examiner*—Binh X. Tran
(74) *Attorney, Agent, or Firm*—Cantor Colburn LLP

(57) ABSTRACT

A method of forming a metal line is provided. A first metal layer and a second metal layer protecting the first metal layer are formed on a base substrate. The first metal layer includes aluminum or aluminum alloy. A photoresist pattern having a linear shape is formed on the second metal layer. The first and second metal layers are dry-etched using etching gas and the photoresist pattern as an etching mask. An etching material is removed from the base substrate, to prevent corrosion of the dry-etched first metal layer. Therefore, the source metal pattern without corrosion may be formed through a dry-etching process so that a manufacturing cost is decreased.

30 Claims, 8 Drawing Sheets

FIG.5C
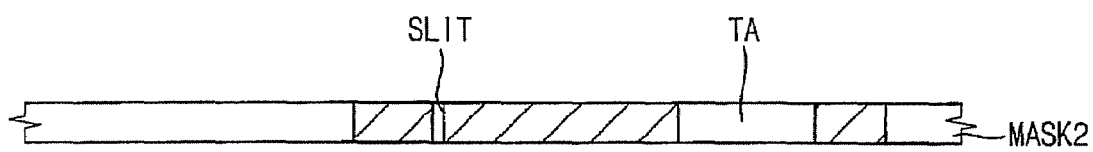
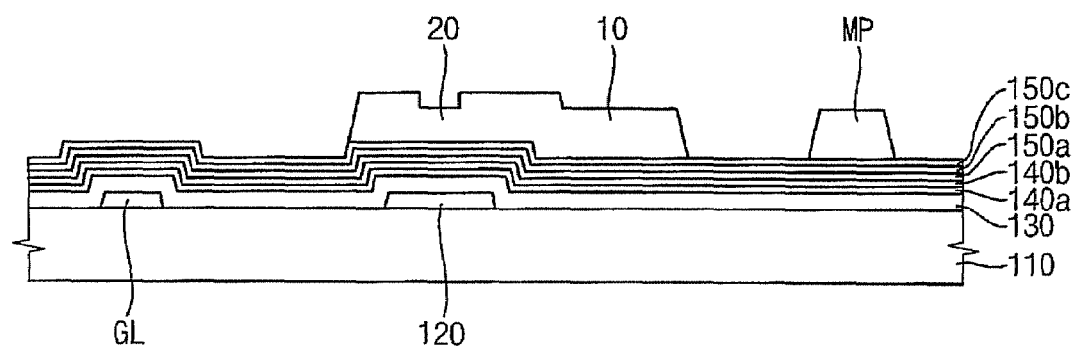
FIG.5D
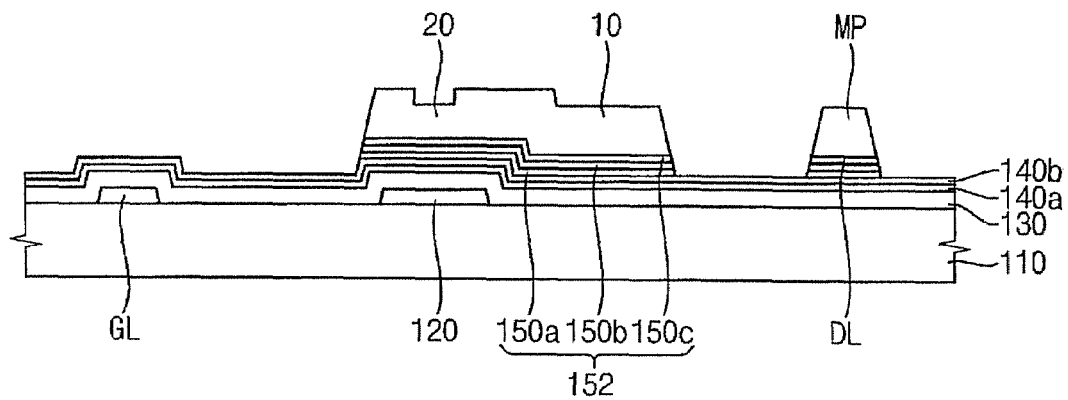

FIG.5G
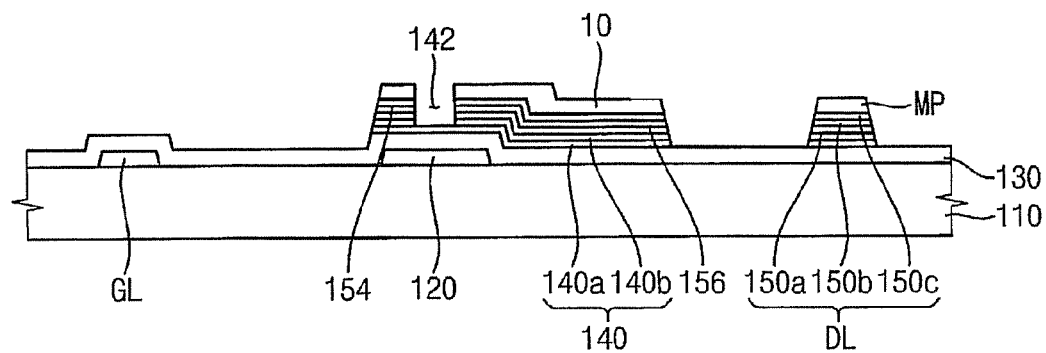
FIG.5H
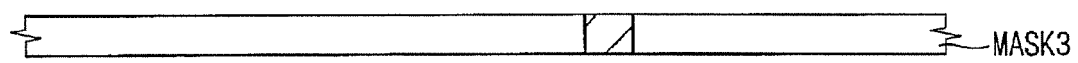
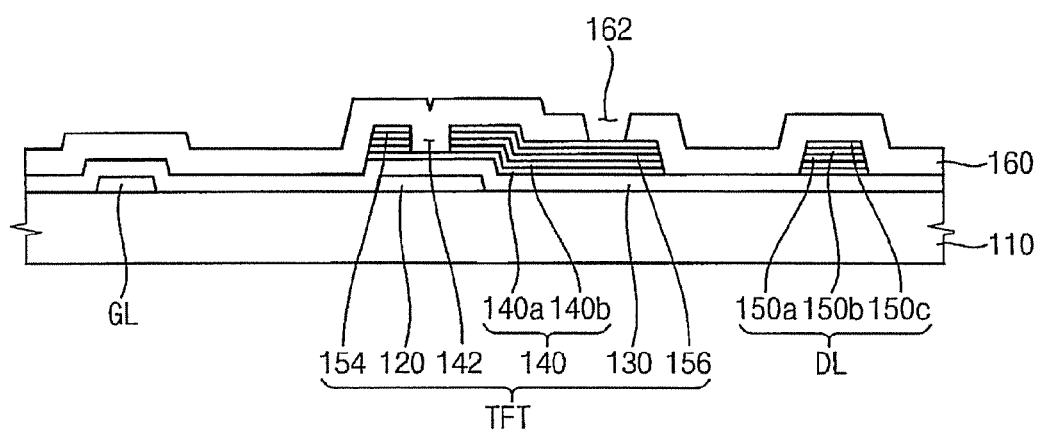

METHOD OF FORMING A METAL LINE AND METHOD OF MANUFACTURING DISPLAY SUBSTRATE HAVING THE SAME

The present application claims priority to Korean Patent Application No. 2006-03656, filed on Jan. 12, 2006 and all the benefits accruing therefrom under 35 U.S.C. §119, and the contents of which in its entirety are herein incorporated by reference.

BACKGROUND OF THE INVENTION

1. Field of the Invention

The present invention relates to a method of forming a metal line and a method of manufacturing a display substrate having the metal line. More particularly, the present invention relates to a method of forming a metal line, which is capable of decreasing a manufacturing cost, and a method of manufacturing a display substrate having the metal line.

2. Description of the Related Art

A liquid crystal display ("LCD") device, in general, includes a display substrate, an opposite substrate, and a liquid crystal layer interposed between the display substrate and the opposite substrate. The liquid crystal layer includes liquid crystals having anisotropic dielectric constant. The liquid crystals vary arrangement in response to an electric field applied thereto, and a light transmittance of the liquid crystal layer is changed, thereby displaying an image.

The display substrate includes a plurality of gate lines that are substantially in parallel with each other and a plurality of source lines that are substantially in parallel with each other. The source lines cross the gate lines. Pixels, are defined by the gate and source lines, and are arranged in a matrix configuration. A switching element and a pixel electrode are formed in each of the pixels. The switching element applies a pixel voltage to the pixel electrode.

The switching element includes a gate electrode, a channel layer, a source electrode, and a drain electrode. The gate electrode is electrically connected to one of the gate lines. The channel layer is overlapped with the gate electrode, and is electrically insulated from the gate electrode. The source electrode is electrically connected to one of the source lines and the channel layer. The drain electrode is spaced apart from the source electrode, and is electrically connected to the channel layer.

When a screen size and a resolution of the LCD device are increased, the display substrate requires a line having lower resistance. The line includes aluminum or aluminum alloy having low resistivity. However, the aluminum reacts with the pixel electrode, and diffuses into silicon. Therefore, when the line includes the aluminum or the aluminum alloy, the line has a multi-layered structure. However, the multi-layered structure increases a manufacturing cost of the LCD device.

BRIEF SUMMARY OF THE INVENTION

The present invention provides a method of forming a metal line, which is capable of decreasing a manufacturing cost.

The present invention also provides a method of manufacturing a display substrate having the above-mentioned metal line.

A method of forming a metal line in accordance with exemplary embodiments of the present invention is provided as follows. A first metal layer and a second metal layer protecting the first metal layer are formed on a base substrate. The first metal layer includes aluminum or aluminum alloy. A photoresist pattern having a linear shape is formed on the second metal layer. The first and second metal layers are dry-etched using etching gas and the photoresist pattern as an etching mask. An etching material remaining on the base substrate is removed from the base substrate to prevent corrosion of the dry-etched first metal layer.

A method of manufacturing a display substrate in accordance with other exemplary embodiments of the present invention is provided as follows. A gate insulating layer and a channel layer are formed on a base substrate including a gate metal pattern, in sequence. The gate metal pattern includes a gate line and a gate electrode of a switching element. A source metal layer is formed on the channel layer. The source metal layer includes a first metal layer including aluminum or aluminum alloy and a second metal layer protecting the first metal layer. The source metal layer having the first and second metal layers is dry-etched to form a dry-etched source metal pattern. The source metal pattern includes a source line, a source electrode, and a drain electrode of the switching element. An etching material is removed from an exposed surface of dry-etched first metal layer. A passivation layer is formed on the base substrate having the source metal pattern from which the etching material is removed. The passivation layer has a contact hole through which the drain electrode is partially exposed. A pixel electrode is formed on the passivation layer. The pixel electrode is electrically connected to the drain electrode through the contact hole.

A method of manufacturing a display substrate in accordance with other exemplary embodiments of the present invention is provided as follows. A source metal layer is formed on a base substrate, the source metal layer including a first metal layer including aluminum or aluminum alloy and a second metal layer protecting the first metal layer. The source metal layer is dry-etched within a vacuum chamber to form a dry-etched source metal pattern. Prior to removing the base substrate from the vacuum chamber, an etching material from the dry-etched source metal pattern is removed to prevent corrosion of the first metal layer.

According to the present invention, the source metal pattern without corrosion may be formed through a dry-etching process so that a manufacturing cost is decreased.

BRIEF DESCRIPTION OF THE DRAWINGS

The above and other features and advantages of the present invention will become more apparent by describing in exemplary embodiments thereof with reference to the accompanying drawings, in which:

FIGS. 5A to 5I are cross-sectional views illustrating an exemplary method of manufacturing an exemplary display substrate in accordance with other exemplary embodiments of the present invention.

DETAILED DESCRIPTION OF THE INVENTION

Figure 1:
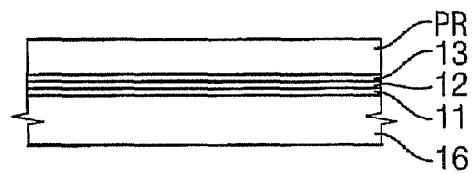
FIGS. 1 to 3 are cross-sectional views illustrating an exemplary method of forming an exemplary metal line in accordance with an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 2:
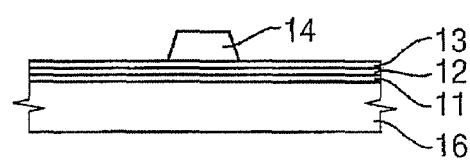
Figure 3:
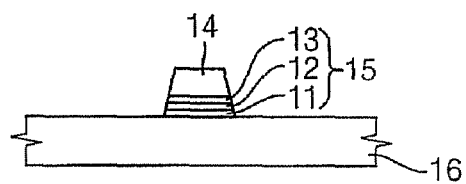

FIGS. 1 to 3 are cross-sectional views illustrating an exemplary method of forming an exemplary metal line in accordance with exemplary embodiments of the present invention.

Referring to FIG. 1, a first metal layer 11, a second metal layer 12, and a third metal layer 13 are formed on a base substrate 16, in sequence. The base substrate 16 may include other metal lines, active layers, and insulating layers, as will be described with respect to FIGS. 4 to 6. The first metal layer 11 includes molybdenum or molybdenum alloy. The second metal layer 12 includes aluminum or aluminum alloy. The third metal layer 13 includes molybdenum or molybdenum alloy. A photoresist film PR is formed on the third metal layer 13.

Referring to FIG. 2, the photoresist film PR (shown in FIG. 1) is exposed through a photo mask (not shown), and the exposed photoresist film PR is developed to form a photoresist pattern 14. For example, the photoresist pattern 14 includes a negative photoresist. An exposed portion of the negative photoresist remains on the third metal layer 13, and an unexposed portion of the negative photoresist is removed by a developing agent.

Referring to FIG. 3, the first, second, and third metal layers 11, 12, and 13 are dry-etched using the photoresist pattern 14 as an etching mask. The dry-etching process may be performed using a plasma etching apparatus. For example, the plasma etching apparatus may be a reactive ion etcher ("RIE"). For example, etching gas of the dry-etching process may include chlorine (Cl) gas.

For example, the etching gas includes a mixture of chlorine gas (Cl2) and oxygen gas (O2). The etching gas may further include nitrogen gas (N2). Nitrogen gas (N2) reacts with etching remnants that are generated during the dry-etching process to form an organic thin film on an etching surface of the etched first, second, and third metal layers 11, 12, and 13. The organic thin film protects the second metal layer 12 from etching.

After the dry-etching process is completed, a metal line 15 having a substantially same shape as the photoresist pattern 14 is formed under the photoresist pattern 14.

A portion of chlorine ions from the chlorine gas (Cl2), used as etching gas during the dry-etching process, may remain on the base substrate 16 that is dry-etched. If the chlorine ions remaining on the base substrate 16 are exposed to air, then the chlorine ions react with moisture in the air to form hydrochloric acid (HCl). The hydrochloric acid (HCl) would then react with the aluminum of the second metal layer 12 to corrode the second metal layer 12 so that a defect may be formed in the metal line 15. In FIGS. 1 to 3, however, the dry-etched base substrate 16 is post-treated in a vacuum chamber of the reactive ion etcher to remove the chlorine ions remaining on the base substrate 16, thus preventing such corrosion of the second metal layer 12.

The post-treating process is performed in the vacuum chamber of the reactive ion etcher. At least one gas of a hydrogen gas (H2) and a water vapor (H2O) is injected into the vacuum chamber of the reactive ion etcher to perform the post-treating process.

Hydrogen ions (H+) are generated from at least one gas of the hydrogen gas (H2) and the water vapor (H2O) that is injected into the vacuum chamber using a plasma discharge. The hydrogen ions (H+) react with the chlorine ions to form a hydrochloric acid (HCl). A pressure in the vacuum chamber is low so that the hydrochloric acid (HCl) is evaporated in the vacuum chamber. The evaporated hydrochloric acid (HCl) is ejected by a vacuum pump that decompresses the vacuum chamber. Therefore, the chlorine ions remaining on the base substrate 16 are removed from the base substrate 16 to prevent the corrosion of the second metal layer 12.

Alternatively, the chlorine ions remaining on the base substrate 16 may be removed using a fluorine-containing gas.

In such an embodiment, the fluorine-containing gas that is injected into the vacuum chamber is discharged by the plasma discharge using radio-frequency ("RF") voltage to generate fluorine radicals. The fluorine radicals have greater reactivity than the chlorine ions. Therefore, the chlorine ions remaining on an exposed surface of the second metal layer 12 are substituted with the fluorine radicals. Thus, a corrosion preventing layer including aluminum fluoride (AlF) is formed on the exposed surface of the second metal layer 12. Therefore, the fluorine radicals prevent the corrosion of the second metal layer 12.

Before the post-treatment process or after the post-treatment process, an ashing process is performed to remove the photoresist pattern 14. An oxygen gas may be injected into the vacuum chamber during the ashing process.

Hereinafter, an exemplary method of manufacturing an exemplary display substrate in accordance with other exemplary embodiments of the present invention is described.

Figure 4:
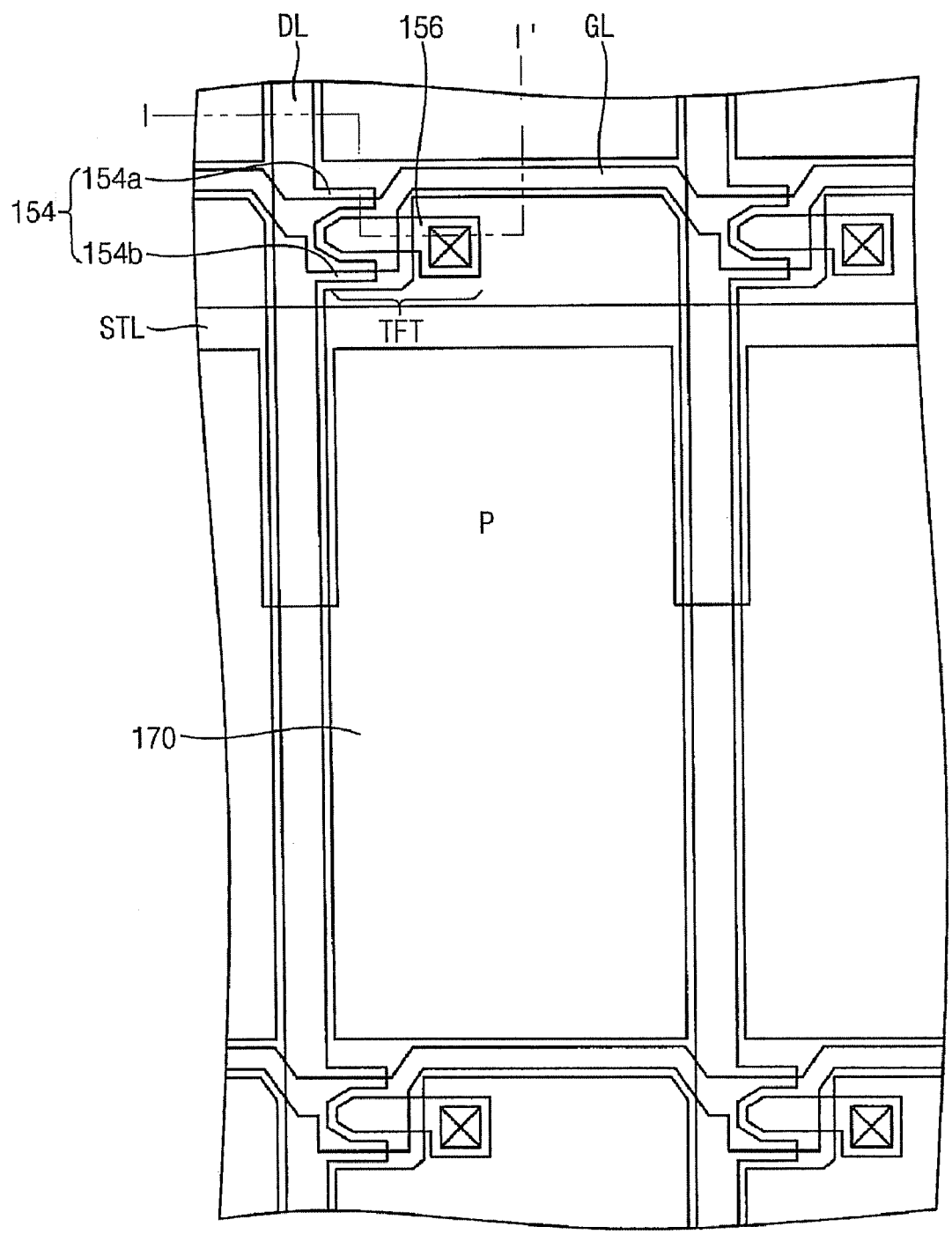
FIG. 4 is a plan view illustrating a portion of an exemplary display substrate manufactured by an exemplary method in accordance with another exemplary embodiment of the present invention.

FIG. 4 is a plan view illustrating an exemplary display substrate manufactured by an exemplary method in accordance with another exemplary embodiment of the present invention.

FIGS. 5A to 5I are cross-sectional views illustrating an exemplary method of manufacturing an exemplary display substrate in accordance with another exemplary embodiment of the present invention.

Figure 5A:
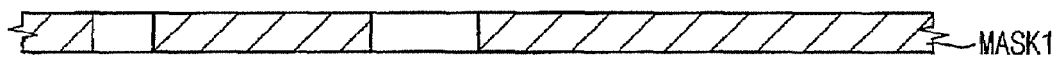

Referring to FIGS. 4 and 5A, a metal layer is formed on a base substrate 110. The metal layer is etched through a photolithography process using a first mask MASK1 to form a first metal pattern including a gate line GL, a gate electrode 120, and a storage common line STL. A plurality of gate lines GL and storage common lines STL may be provided on the base substrate 110, and each gate line GL may have a plurality of gate electrodes 120 protruding there from.

Examples of a metal that can be used for the metal layer include chromium, aluminum, tantalum, molybdenum, titanium, tungsten, copper, silver, etc. These can be used alone, an alloy thereof or in a combination thereof. For example, the metal layer may be deposited on the base substrate 110 through a sputtering process. In addition, the metal layer may have a multi-layered structure including a plurality of metal layers.

Figure 5B:
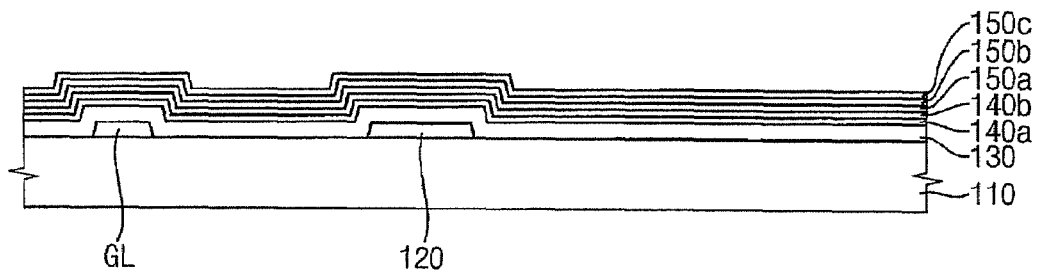

Referring to FIGS. 4 and 5B, a gate insulating layer 130, an active layer 140a and an ohmic contact layer 140b are formed on the base substrate 110 having the first metal pattern, in sequence, through a plasma enhanced chemical vapor deposition ("PECVD") process. The gate insulating layer 130 may include silicon nitride. The active layer 140a may include amorphous silicon (a-Si:H). The ohmic contact layer 140b may be formed by implanting n+ ions on an upper portion of the amorphous silicon (a-Si:H) at a high concentration.

A first metal layer 150a, a second metal layer 150b and a third metal layer 150c are formed on the ohmic contact layer 140b, in sequence. The first metal layer 150a may include molybdenum (Mo) or molybdenum alloy. The second metal layer 150b may include aluminum (Al) or aluminum alloy. The third metal layer 150c may include molybdenum (Mo) or molybdenum alloy.

Referring to FIG. 5C, a photoresist film (not shown) is coated on a substantially entire surface of the third metal layer 150c. The photoresist film is exposed through a second mask MASK2 having a slit SLIT. In FIG. 5C, the photoresist film includes a positive photoresist. An exposed portion of the positive photoresist is removed by a developing agent.

About 100% of light having passed through an opening portion TA of the second mask MASK2 is irradiated onto the photoresist film. However, light incident into the slit SLIT of the second mask MASK2 is dispersed by the slit SLIT. Therefore, the intensity of the light irradiated onto the photoresist film through the slit SLIT is smaller than the light irradiated onto the photoresist film through the opening portion TA. The exposed photoresist film is developed so that an exposed portion of the photoresist film is removed and an unexposed portion of the photoresist film remains. Thus, a photoresist pattern MP, including first and second patterned portions 10, 20, is formed on the third metal layer 150c.

The portion of the photoresist film exposed through the slit SLIT is partially exposed so that the partially exposed portion of the photoresist film corresponding to the slit SLIT has a smaller thickness than the unexposed portion of the photoresist film.

In FIG. 5C, a first patterned portion 10 represents the unexposed portion of the photoresist pattern MP, and a second patterned portion 20 represents the partially exposed portion of the photoresist pattern MP corresponding to the slit SLIT.

Referring again to FIGS. 4 and 5C, the first patterned portion 10 corresponds to a source line DL (also termed a data line), a source electrode 154, and a drain electrode 156 of a switching element, such as a thin film transistor ("TFT"). The second patterned portion 20 corresponds to a channel portion of the switching element.

Referring to FIGS. 4 and 5D, the first, second, and third metal layers 150a, 150b, and 150c are dry-etched using the photoresist pattern MP to form a second metal pattern including the source line DL and an electrode pattern 152. The dry-etching process may be performed using a plasma etching apparatus. For example, the plasma etching apparatus may be a reactive ion etcher ("RIE"). The dry-etching process may be performed using a chlorine-containing gas.

Alternatively, the first, second, and third metal layers 150a, 150b, and 150c may be wet-etched to form the second metal pattern including the source line DL and the electrode pattern 152.

Figure 5E:
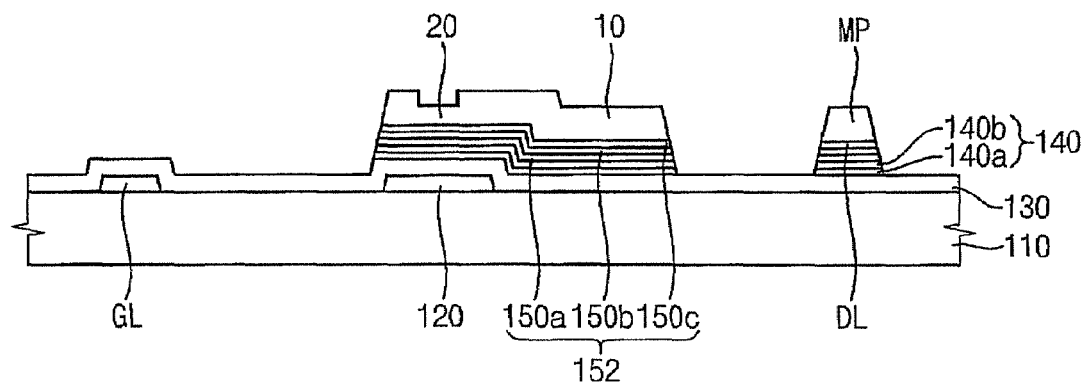

Referring to FIGS. 4 and 5E, the active layer 140a and the ohmic contact layer 140b are dry-etched using the photoresist pattern MP and the second metal pattern, including the source line DL and the electrode pattern 152, as an etching mask. Thus, the channel layer 140 is patterned so that the channel layer 140 under the second metal pattern may have a substantially same shape as the second metal pattern.

Figure 5F:
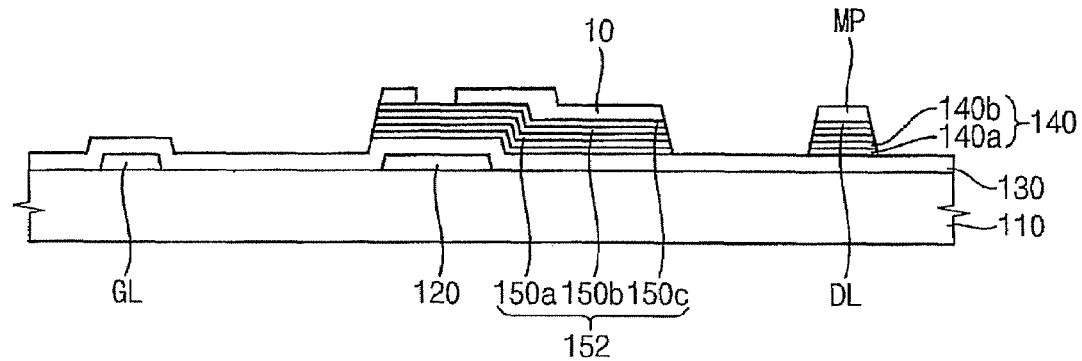
Figure 51:
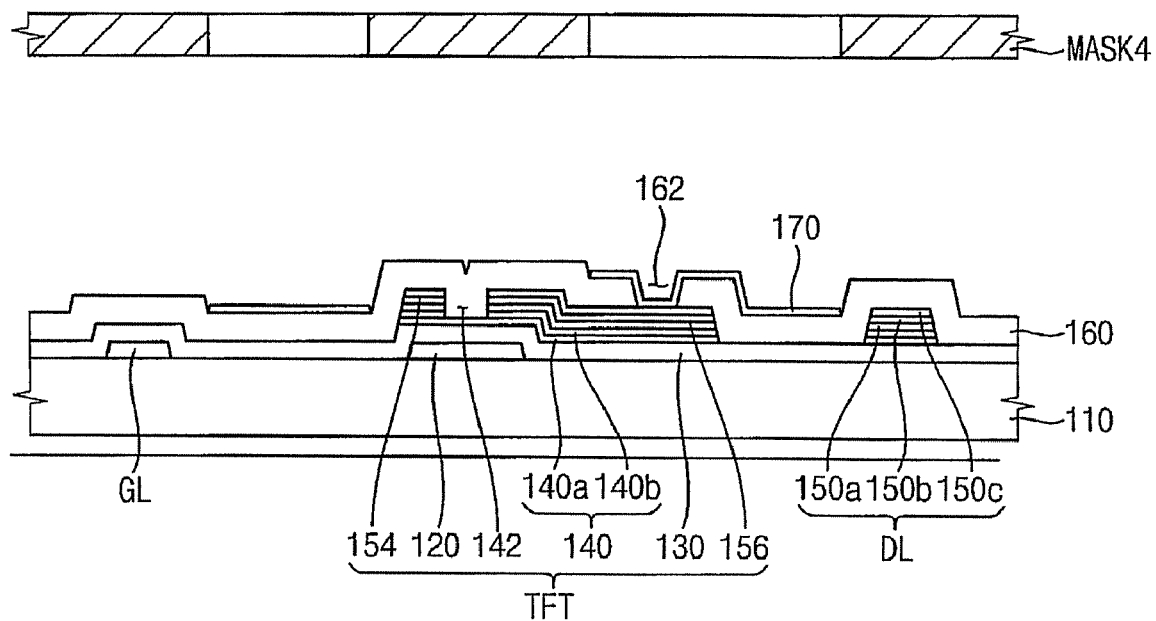

Referring to FIG. 5F, an ashing process is performed on the photoresist pattern MP using an oxygen (O2) plasma discharge so that a thickness of the photoresist pattern MP is decreased. Therefore, the second patterned portion 20 that has a smaller thickness than the first patterned portion 10 is removed. In addition, a thickness of the first patterned portion 10 is decreased so that the first pattern portion 10, having a smaller thickness than in the prior step, remains on the third metal layer 150c. When the second patterned portion 20 is removed, the electrode pattern 152 is partially exposed.

Referring to FIGS. 4 and 5G, the exposed electrode pattern 152 that is exposed through the photoresist pattern MP, where the second patterned portion 20 had been removed, is dry-etched. Therefore, the source electrode 154 of the switching element TFT and the drain electrode 156 spaced apart from the source electrode 154 are formed. The electrode pattern 152 may be dry-etched using a chlorine-containing gas.

Upon dry-etching the electrode pattern 152 in the location where the second patterned portion 20 had been, an ohmic contact layer 140b is exposed between the source electrode 154 and the drain electrode 156.

The exposed portion of the ohmic contact layer 140b is dry-etched using the source electrode 154 and the drain electrode 156 as an etching mask. Thus, the channel portion 142 including the active layer 140a that is partially exposed between the source electrode 154 and the drain electrode 156 is formed.

The dry-etching process and the ashing process shown in FIGS. 5D to 5G are performed in substantially the same vacuum chamber. Thus, the base substrate 110 does not need to be transported from the vacuum chamber so that a manufacturing process of the display substrate 100 may be simplified.

If the base substrate 110 is then transported from the vacuum chamber after the etching process using the chlorine-containing gas, the chlorine ions may react with the second metal layer 150b so that the chlorine ions may remain on the second metal layer 150b. When the remaining chlorine ions are exposed to the air, the chlorine ions may react with a water vapor (H2O) to form a hydrochloric acid (HCl), that would corrode the second metal layer 150b including the aluminum. However, in FIG. 5G, the base substrate 110 in the vacuum chamber 110 is post-treated to remove the chlorine ions from the second metal layer 150b, prior to removing the base substrate 110 from the vacuum chamber, thereby preventing the corrosion of the second metal layer 150b once the base substrate 110 is transported from the vacuum chamber. The dry-etching process, the ashing process, and the post-treating process shown in FIGS. 5D to 5G will be further described in the following FIG. 6.

Referring to FIGS. 4 and 5H, a passivation layer 160 is formed on the gate insulating layer 130 on which the second metal pattern, including the source line DL and the source and drain electrodes 154 and 156, is formed. The passivation layer 160 is further formed on the active layer 140a that is exposed in the channel portion 142. The passivation layer 160 is partially removed through a photolithography process using a third mask MASK3 as an etching mask to form a contact hole 162 through which the drain electrode 156 is partially exposed.

Referring to FIGS. 4 and 5I, a transparent conductive layer (not shown) is formed on the passivation layer 160 having the contact hole 162. The transparent conductive layer is further formed on the portion of the drain electrode 156 that is exposed through the contact hole 162. Examples of a transparent conductive material that can be used for the transparent conductive layer include indium tin oxide ("ITO"), tin oxide ("TO"), indium zinc oxide ("IZO"), zinc oxide ("ZO"), indium tin-zinc oxide ("ITZO"), amorphous indium tin oxide ("a-ITO"), etc. The transparent conductive layer is partially etched using a fourth mask MASK4 as an etching mask. Thus, a pixel electrode 170, electrically connected to the drain electrode 156 through the contact hole 162, is formed on the passivation layer 160.

In FIGS. 5H and 5I, the passivation layer 160 is formed using the third mask MASK3, and the pixel electrode 170 is formed using the fourth mask MASK4. Alternatively, a passivation layer and a pixel electrode may be formed using a single mask.

Figure 6:
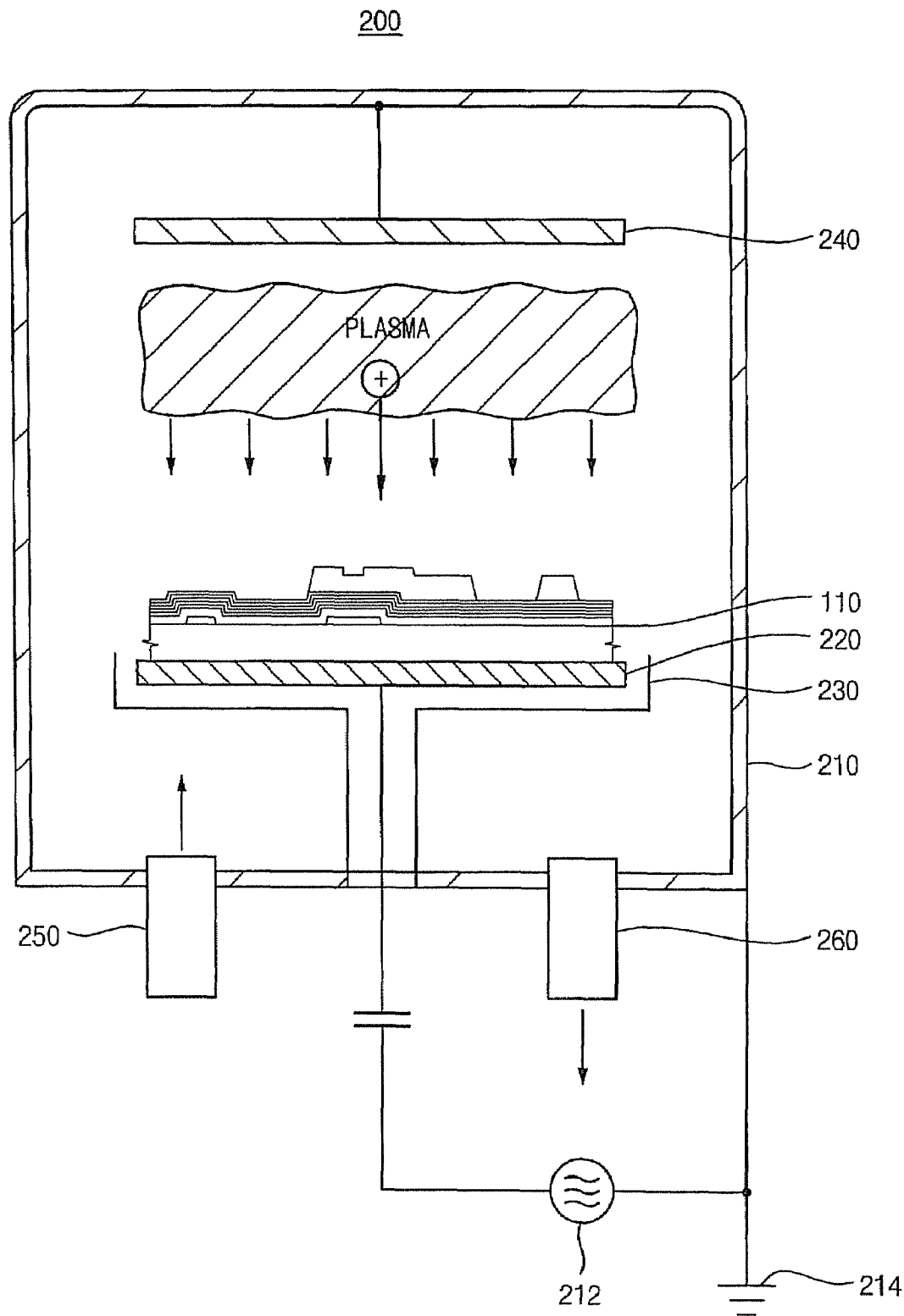
FIG. 6 is a cross-sectional and schematic view illustrating an exemplary reactive ion etcher ("RIE") in accordance with exemplary embodiments of the present invention.

FIG. 6 is a cross-sectional view illustrating an exemplary reactive ion etcher ("RIE") in accordance with exemplary embodiments of the present invention.

Referring to FIG. 6, the reactive ion etcher 200 includes a vacuum chamber 210, a radio frequency ("RF") generating part 212, and a power supplying part 214. A base substrate 110 is processed in the vacuum chamber 210. The vacuum chamber 210 includes a lower electrode 220, a grounding shield 230, an upper electrode 240, a gas supplying part 250, and a vacuum pump 260.

The lower electrode 220 is on the grounding shield 230, and is connected to the RF generating part 212 to receive the RF voltage. The base substrate 110 is disposed on the lower electrode 220. The upper electrode 240 is on the lower electrode 220, such as disposed above the lower electrode 220, and is electrically connected to the vacuum chamber 210. Alternatively, the upper electrode 240 may be omitted, and the vacuum chamber 210 may function as the upper electrode. The lower electrode 220 may be an anode, and the upper electrode 240 may be a cathode.

The gas supplying part 250 supplies the vacuum chamber 210 with gas for a dry-etching process, an ashing process, and a post-treating process. The gas that is from the gas supplying part 250 is plasma discharged by the RF voltage from the RF generating part 212.

The vacuum pump 260 exhausts the gas in the vacuum chamber 210 to decrease the pressure of the vacuum chamber 210. Thus, the pressure in the vacuum chamber 210 may be a substantially vacuum state.

Hereinafter, the dry-etching process, the ashing process, and the post-treating process shown in FIGS. 5D to 5G are further described with reference to FIGS. 5D to 5G and 6.

Referring to FIG. 6, a base substrate 110 is arranged on the lower electrode 220. A first metal pattern including a gate electrode 120 and a gate line GL, a gate insulating layer 130, an active layer 140a, an ohmic contact layer 140b, a first metal layer 150a, a second metal layer 150b, a third metal layer 150c, and a photoresist pattern MP are formed on the base substrate 110, in sequence, such as shown in FIG. 5C.

An etching gas supplied from the gas supplying part 250 is injected into the vacuum chamber 210. For example, the etching gas includes a mixture of chlorine gas (Cl2) and oxygen gas (O2). The etching gas may further include nitrogen gas (N2) to prevent a corrosion of the second metal layer 150b.

The etching gas from the gas supplying part 250 is plasma discharged by the RF voltage from the RF generating part 212 in the vacuum chamber 210. Thus, a portion of the first, second, and third metal layers 150a, 150b and 150c on which the photoresist pattern MP is not formed is etched. Therefore, a second metal pattern including a source line DL (shown in FIG. 5D) and an electrode pattern 152 (shown in FIG. 5D) are formed.

After the dry-etching process for forming the second metal pattern is completed, an etching gas provided from the gas supplying part 250 is injected into the vacuum chamber 210 to etch the active layer 140a and the ohmic contact layer 140b. Examples of the etching gas that can be used for etching the active layer 140a and the ohmic contact layer 140b include sulfur hexa-fluoride (SF6) gas, chlorine (Cl2) gas, carbon tetra-fluoride (CF4) gas, and hydrochloric acid (HCl) gas, etc. These can be used alone or in a combination thereof.

The etching gas injected into the vacuum chamber 210 is plasma discharged by the RF voltage from the RF generating part 212 to partially etch the active layer 140a and the ohmic contact layer 140b that are exposed where the second metal pattern has been removed. Therefore, a channel layer 140 (shown in FIG. 5E) is formed under the second metal pattern, and has a substantially same shape as the second metal pattern.

After the dry-etching process for forming the channel layer 140 is completed, a thickness of the photoresist pattern MP is decreased through an ashing process. The oxygen (O2) gas provided from the gas supplying part 250 is injected into the vacuum chamber 210 to perform the ashing process. The oxygen (O2) gas is plasma discharged by the RF voltage. The thickness of the photoresist pattern MP is decreased by the plasma discharged oxygen gas so that the first patterned portion 10 remains on the third metal layer 150c but with a reduced thickness, and the second patterned portion 20 having a smaller thickness than the first patterned portion 10 is removed from the base substrate 110. Therefore, as shown in FIG. 5F, the second metal pattern is exposed in a region from which the second patterned portion 20 is removed.

After the ashing process is completed, etching gas for etching the exposed portion of the second metal pattern, where the second patterned portion 20 was removed, is injected into the vacuum chamber 210 from the gas supplying part 250. The etching gas includes a chlorine-containing gas. For example, the etching gas includes a mixture of chlorine gas and oxygen gas. The etching gas may further include nitrogen gas.

The second metal pattern has a multi-layered structure including the first metal layer 150a, the second metal layer 150b, and the third metal layer 150c. The first metal layer 150a includes molybdenum or molybdenum alloy. The second metal layer 150b includes aluminum or aluminum alloy. The third metal layer 150c includes molybdenum or molybdenum alloy. In addition, a native oxide layer including aluminum oxide may be formed between the first and second metal layers 150a and 150b and between the second and third metal layers 150b and 150c.

The etching gas for etching the first and third metal layers 150a and 150c may further include sulfur hexa-fluoride (SF6) gas. The etching gas may further include boron tri-chloride (BCl3) gas to etch the native oxide layer including the aluminum oxide.

As shown in FIG. 5G, after the dry-etching process for etching the exposed portion of the second metal pattern is completed, the source electrode 154 of the switching element TFT and the drain electrode 156 are formed. The drain electrode 156 is spaced apart from the source electrode 154. The ohmic contact layer 140b is exposed between the source electrode 154 and the drain electrode 156.

The ohmic contact layer 140b is dry-etched using the source electrode 154 and the drain electrode 156 as an etching mask. Examples of the etching gas that can be used for dry-etching the ohmic contact layer 140b include sulfur hexa-fluoride (SF6) gas, chlorine (Cl2) gas, carbon tetra-fluoride (CF4) gas, and hydrochloric acid (HCl) gas, etc. These can be used alone or in a combination thereof. The ohmic contact layer 140b is partially etched to form the channel portion 142 including the active layer 140a that is partially exposed between the source electrode 154 and the drain electrode 156.

After the dry-etching processes are completed, chlorine ions that are generated from the chlorine-containing gas remain on the base substrate 110. The chlorine ions react with aluminum on the second metal layer 150b that is exposed by the dry-etching processes to form an aluminum chloride compound on the second metal layer 150b.

If the base substrate 110 including the chlorine ions is then removed from the vacuum chamber 210 and exposed to air, the chlorine ions would react with the water vapor of the air to form hydrochloric acid (HCl). The hydrochloric acid (HCl) would corrode the second metal layer 150b including aluminum or aluminum alloy.

However, in FIGS. 5G and 6, the base substrate 110 is post-treated to remove the chlorine ions remaining on the base substrate 110, before the base substrate 110 is removed from the vacuum chamber 210.

In order to post-treat the base substrate 110, at least one gas of a hydrogen (H2) gas and a water vapor (H2O) that is provided from the gas supplying part 250 is injected into the vacuum chamber 210. When the water vapor is injected into the vacuum chamber 210, the gas supplying part 250 may further include a heater to evaporate water.

The gas, including at least one gas of a hydrogen (h2) gas and a water vapor (H2O), is injected into the vacuum chamber 210 and plasma discharged to form hydrogen ions (H+). The hydrogen ions (H+) react with the chlorine ions remaining on the base substrate 110 to form the hydrochloric acid (HCl). The hydrochloric acid (HCl) is evaporated by equilibrium vapor pressure. The evaporated hydrochloric acid (HCl) is ejected from the vacuum chamber 210 by the vacuum pump 260. Thus, the chlorine ions are removed from the base substrate 110 to prevent the second metal layer 150b from corroding upon subsequent removal of the base substrate 110 from the vacuum chamber 210.

In FIGS. 5G and 6, post-treating process has been described as employing the gas including hydrogen gas and the water vapor injected into the vacuum chamber 210. In alternative exemplary embodiments, a fluorine-containing gas may be supplied into the vacuum chamber 210 to perform the post-treating process.

In such embodiments, the fluorine-containing gas is provided from the gas supplying part 250 and plasma discharged by the RF voltage to form fluorine radicals. The fluorine radicals have greater reactivity than the chlorine ions. Therefore, the chlorine ions remaining on the exposed surface of the second metal layer 150b are substituted with the fluorine radicals. Thus, a corrosion preventing layer including aluminum fluoride (AlF) is formed on the exposed surface of the second metal layer 150b. Therefore, the fluorine radicals prevent the corrosion of the second metal layer 150b.

In FIG. 6, the dry-etching process and the post-treating process are performed by the reactive ion etcher 200 using the RF voltage from the RF generating part 212. Alternatively, the dry-etching process and the post-treating process may also be performed by various dry-etching apparatuses.

According to the present invention, the metal layer including the aluminum is dry-etched by the chlorine-containing gas, and the chlorine ions remaining on the etched metal layer are removed through the post-treating process prior to removal of the substrate from the etching apparatus. The corrosion of the metal layer is prevented by the post-treating process so that the metal layer may be etched using the dry-etching process instead of a wet-etching process that is more expensive than the dry-etching process. Thus, a manufacturing cost is decreased. In addition, the etching process for etching the metal layer and the etching process for etching the channel portion may be performed in substantially the same vacuum chamber, thereby simplifying a manufacturing process.

This invention has been described with reference to exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A method of manufacturing a display substrate, the method comprising:
    forming a gate insulating layer and a channel layer on a base substrate including a gate metal pattern, in sequence, the gate metal pattern including a gate line and a gate electrode of a switching element;
    forming a source metal layer on the channel layer, the source metal layer including a first metal layer including aluminum or aluminum alloy and a second metal layer protecting the first metal layer;
    dry-etching the source metal layer having the first and second metal layers to form a dry-etched source metal pattern, the source metal pattern including a source line, a source electrode and a drain electrode of the switching element;
    removing an etching material from an exposed surface of dry-etched first metal layer;
    forming a passivation layer on the base substrate having the source metal pattern from which the etching material is removed, the passivation layer having a contact hole through which the drain electrode is partially exposed; and
    forming a pixel electrode on the passivation layer, the pixel electrode electrically connected to the drain electrode through the contact hole.

2. The method of claim 1, wherein forming the source metal layer includes:
    forming an auxiliary metal layer between the base substrate and the first metal layer to protect the first metal layer; and
    forming the second metal layer on the first metal layer.

3. The method of claim 1, wherein the second metal layer comprises molybdenum or molybdenum alloy.

4. The method of claim 1, further comprising etching the channel layer using the source metal pattern as an etching mask.

5. The method of claim 1, wherein forming the source metal pattern includes:
    partially etching the source metal layer using a photoresist pattern having a groove pattern to form the source line and an electrode pattern;
    partially etching the photoresist pattern to decrease a thickness of the photoresist pattern so that the electrode pattern corresponding to the groove pattern is partially exposed to form an exposed portion of the electrode pattern; and
    dry-etching the exposed portion of the electrode pattern using etching gas to form the source electrode and the drain electrode.

6. The method of claim 5, further comprising etching the source metal layer using the photoresist pattern as an etching mask.

7. The method of claim 5, wherein dry-etching the exposed portion of the electrode pattern using etching gas includes using etching gas comprising chlorine-containing gas.

8. The method of claim 7, wherein dry-etching the exposed portion of the electrode pattern using etching gas includes using etching gas further comprising nitrogen gas.

9. The method of claim 1, wherein removing an etching material from an exposed surface of the dry-etched first metal layer includes removing chlorine ions.

10. The method of claim 9, wherein removing the etching material includes:
    supplying the dry-etched source metal pattern with fluorine-containing gas; and
    plasma discharging the fluorine-containing gas to form a corrosion preventing layer on an exposed surface of the first metal layer.

11. The method of claim 9, wherein removing the etching material includes:
    supplying the dry-etched source metal pattern with at least one gas selected from the group consisting of water vapor and hydrogen gas; and
    plasma discharging the at least one gas to remove the chlorine ions.

12. The method of claim 11, wherein plasma discharging the at least one gas includes plasma discharging by a radio frequency voltage.

13. The method of claim 1, wherein the channel layer comprises an active layer and an ohmic contact layer on the active layer.

14. The method of claim 13, further comprising partially etching the ohmic contact layer using the source electrode and the drain electrode as an etching mask so that the active layer is partially exposed.

15. A method of manufacturing a display substrate, the method comprising:
    forming a channel layer on a base substrate;
    forming a source metal layer on the channel layer on the base substrate, the source metal layer including a first metal layer and a second metal layer protecting the first metal layer;
    dry-etching the source metal layer and the channel layer using a mask to form a source metal pattern, the source metal pattern including a source line, a source electrode and a drain electrode of a switching element; and
    removing an etching material from an exposed surface of the dry-etched first metal layer.

16. The method of claim 15, wherein the first metal layer comprises aluminum and/or aluminum alloy.

17. The method of claim 15, wherein the channel layer and the source line have substantially the same shape when viewed in a plan view.

18. The method of claim 15, wherein forming the source metal layer includes:
forming an auxiliary metal layer between the base substrate and the first metal layer to protect the first metal layer; and
forming the second metal layer on the first metal layer.

19. The method of claim 15, wherein the second metal layer comprises molybdenum or molybdenum alloy.

20. The method of claim 15, further comprising etching the channel layer using the source metal pattern as an etching mask.

21. The method of claim 15, wherein forming the source metal pattern includes:
partially etching the source metal layer using a photoresist pattern having a groove pattern to form the source line and an electrode pattern;
partially etching the photoresist pattern to decrease a thickness of the photoresist pattern so that the electrode pattern corresponding to the groove pattern is partially exposed to form an exposed portion of the electrode pattern; and
dry-etching the exposed portion of the electrode pattern using etching gas to form the source electrode and the drain electrode.

22. The method of claim 21, further comprising etching the source metal layer using the photoresist pattern as an etching mask.

23. The method of claim 21, wherein dry-etching the exposed portion of the electrode pattern using an etching gas includes using an etching gas comprising chlorine gas.

24. The method of claim 23, wherein dry-etching the exposed portion of the electrode pattern using an etching gas includes using an etching gas further comprising nitrogen gas.

25. The method of claim 15, wherein removing an etching material from an exposed surface of the dry-etched first metal layer includes removing chlorine ions.

26. The method of claim 25, wherein removing the etching material includes:
supplying the dry-etched source metal pattern with a fluorine-containing gas; and
plasma discharging the fluorine-containing gas to form a corrosion preventing layer on an exposed surface of the first metal layer.

27. The method of claim 25, wherein removing the etching material includes:
supplying the dry-etched source metal pattern with at least one gas selected from the group consisting of water vapor and hydrogen gas; and
plasma discharging the gas to remove the chlorine ions.

28. The method of claim 27, wherein plasma discharging the gas includes plasma discharging by a radio frequency voltage.

29. The method of claim 15, wherein the channel layer comprises an active layer and an ohmic contact layer on the active layer.

30. The method of claim 29, further comprising partially etching the ohmic contact layer using the source electrode and the drain electrode as an etching mask so that the active layer is partially exposed.

* * * * *